US00RE47383E

(19) United States
(12) Reissued Patent
Delano

(10) Patent Number: US RE47,383 E
(45) Date of Reissued Patent: May 7, 2019

(54) RESOURCE POOLING AMPLIFIER

(71) Applicant: Maxim Integrated Products, Inc., San Jose, CA (US)

(72) Inventor: Cary L. Delano, Los Altos, CA (US)

(21) Appl. No.: 15/005,609

(22) Filed: Jan. 25, 2016

Related U.S. Patent Documents

Reissue of:
(64) Patent No.: 8,773,196
Issued: Jul. 8, 2014
Appl. No.: 13/626,672
Filed: Sep. 25, 2012

U.S. Applications:
(60) Provisional application No. 61/541,397, filed on Sep. 30, 2011.

(51) Int. Cl.
*H03F 3/38* (2006.01)
*H03F 3/217* (2006.01)
(Continued)

(52) U.S. Cl.
CPC ..... *H03F 3/38* (2013.01); *H03F 3/005* (2013.01); *H03F 3/181* (2013.01); *H03F 3/217* (2013.01);
(Continued)

(58) Field of Classification Search
CPC ..... H03F 3/38; H03F 3/2171; H03F 3/217; H03F 3/181; H03F 3/45928; H03F 3/005; Y10T 307/76
See application file for complete search history.

(56) References Cited

U.S. PATENT DOCUMENTS 5,847,602 A 12/1998 Su
6,166,527 A 12/2000 Dwelley et al.
(Continued)

FOREIGN PATENT DOCUMENTS

CN 1738195 A 2/2006
CN 101090257 A 12/2007
(Continued)

OTHER PUBLICATIONS

International Search Report and Written Opinion of the International Searching Authority for PCT Application No. PCT/US2012/057343, mailed on Dec. 4, 2012, 12 pages.
(Continued)

*Primary Examiner* — Deandra M Hughes

(57) ABSTRACT

A new type of amplifier, herein designated a resource pooling amplifier, involves extended usage of one or more inductors that is implemented by sharing. The sharing is either by switching the inductor or inductors among more than one load terminal at the same time (e.g., a bridged configuration or two different loads terminals with different polarity requirements) or by using the inductor or inductors for more than one purpose at different times. The inductor or inductors may be time shared such as by allocating different phases of a clock. The inductor or inductors may also be shared by monitoring load requirements and using the inductor or inductors only when needed (leaving other inductor cycles for other loads). In addition, inductor sharing may be implemented during different application requirements such as if two or more loads are not needed at the same time in a system. These types of sharing may be combined.

21 Claims, 12 Drawing Sheets

(51) Int. Cl.
*H03F 3/181* (2006.01)
*H03F 3/45* (2006.01)
*H03F 3/00* (2006.01)

(52) U.S. Cl.
CPC ..... *H03F 3/45928* (2013.01); *Y10T 307/76* (2015.04)

(56) References Cited

U.S. PATENT DOCUMENTS 6,518,849 B1 * 2/2003 Delano ..... H03F 3/2171 330/10
6,577,194 B2 * 6/2003 Delano ..... H03F 3/2171 330/10
6,630,899 B2 10/2003 Jayaraman
6,924,757 B2 * 8/2005 Adams ..... H03F 3/217 341/143
7,092,265 B2 * 8/2006 Kernahan ..... H02M 3/157 323/282
7,257,164 B2 * 8/2007 Magrath ..... H03F 3/217 341/143
7,365,661 B2 * 4/2008 Thomas ..... H02M 3/157 341/117
7,612,608 B2 11/2009 Kozak et al.
7,723,965 B2 5/2010 Lesso et al.
7,948,720 B2 5/2011 Mok et al.
8,174,333 B1 5/2012 Philips et al.
8,228,118 B1 * 7/2012 Hsieh ..... 330/10
8,305,246 B2 * 11/2012 Kinyua ..... H03F 3/217 341/143
8,410,851 B1 4/2013 Hsieh
8,451,057 B2 5/2013 Hsieh
8,624,429 B2 * 1/2014 Jing ..... H02M 3/158 307/18
8,773,196 B2 7/2014 Delano
8,937,820 B2 * 1/2015 Huisman ..... G01R 33/3852 323/283
2006/0208798 A1 * 9/2006 Labbe ..... H03F 3/217 330/251
2009/0262556 A1 10/2009 Tomiyoshi et al.
2010/0060354 A1 3/2010 Maeda
2010/0109767 A1 5/2010 Midya et al.
2010/0188146 A1 7/2010 Chung et al.
2011/0032034 A1 2/2011 Jurzitza
2011/0037516 A1 2/2011 Nejati et al.

FOREIGN PATENT DOCUMENTS

JP 2003037478 A 2/2003
JP 2009-284413 A 12/2009
WO WO-2007125895 A1 11/2007
WO WO-2011017368 A1 2/2011

OTHER PUBLICATIONS

International Preliminary Report on Patentability for PCT Application No. PCT/US2012/057343, mailed on Apr. 10, 2014, 8 pages.
Correspondence dated Jul. 30, 2015 enclosing First Office Action for Chinese Patent Application No. 201280047812.0, 7 pages.
Supplementary European Search Report dated May 22, 2015 corresponding to European Patent Application No. 12836883.4-1810, 5 pages.
Translation of Notice of Reasons for Refusal received on Jan. 20, 2015 corresponding to Japanese Patent Application No. 2014-533685, 2 pages.

* cited by examiner

Amended

*PRIOR ART CLASS D AMPLIFIER*

*NEW ART*

RESOURCE POOLING AMPLIFIER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCES TO RELATED APPLICATIONS

This application claims benefit under 35 U.S.C. 119(e) to Provisional Patent Application Ser. No. 61/541,397 filed Sep. 30, 2011.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This invention relates to electronic power amplifiers.

There are many different types of power amplifiers available with different tradeoffs. Class AB amplifiers are good for high linearity and low cost structure but have high power dissipation. Most Class D amplifiers add the cost of output inductors and can produce difficulties with EMI but have low power dissipation. Sometimes the power supply voltage on a Class AB amplifier is modified with a Class D regulator in order to have some of the benefits of a Class AB amplifier and some of a Class D amplifier.

In power supply generation circuitry, single inductor multiple output (SIMO) regulators have been used to share one inductor for multiple outputs. These regulators, however, have not been successfully used as amplifiers in the past when used with other functions. Also, non-PWM (pulse width modulation) variations on Class D amplifiers such as PDM amplifiers are also collectively included in the Class D classification in this disclosure.

What is needed is an amplifier that has the advantages of a Class D amplifier with its high efficiency but with reduced expense and reduced EMI problems.

SUMMARY OF THE INVENTION

According to the invention, a new type of amplifier, herein designated a resource pooling amplifier, involves extended usage of at least one inductor that is implemented by sharing. The sharing is either by switching the inductor or inductors among more than one load terminal at the same time (e.g., a bridged configuration or two different loads terminals with different polarity requirements) or by using the inductor or inductors for more than one purpose at different times. The inductor or inductors may be time shared such as by allocating usage according to different phases of a clock. The inductor or inductors may also be shared by monitoring load requirements and using the inductor or inductors only when needed (leaving other inductor cycles for other loads). In addition, inductor sharing may be implemented during different application requirements such as if two or more loads are not needed to be driven at the same time in a system. These types of sharing may be combined.

The invention will be better understood by reference to the following detailed description in connection with the accompanying drawings, which are incorporated into the specification for all purposes.

DETAILED DESCRIPTION OF THE INVENTION

Figure 1:
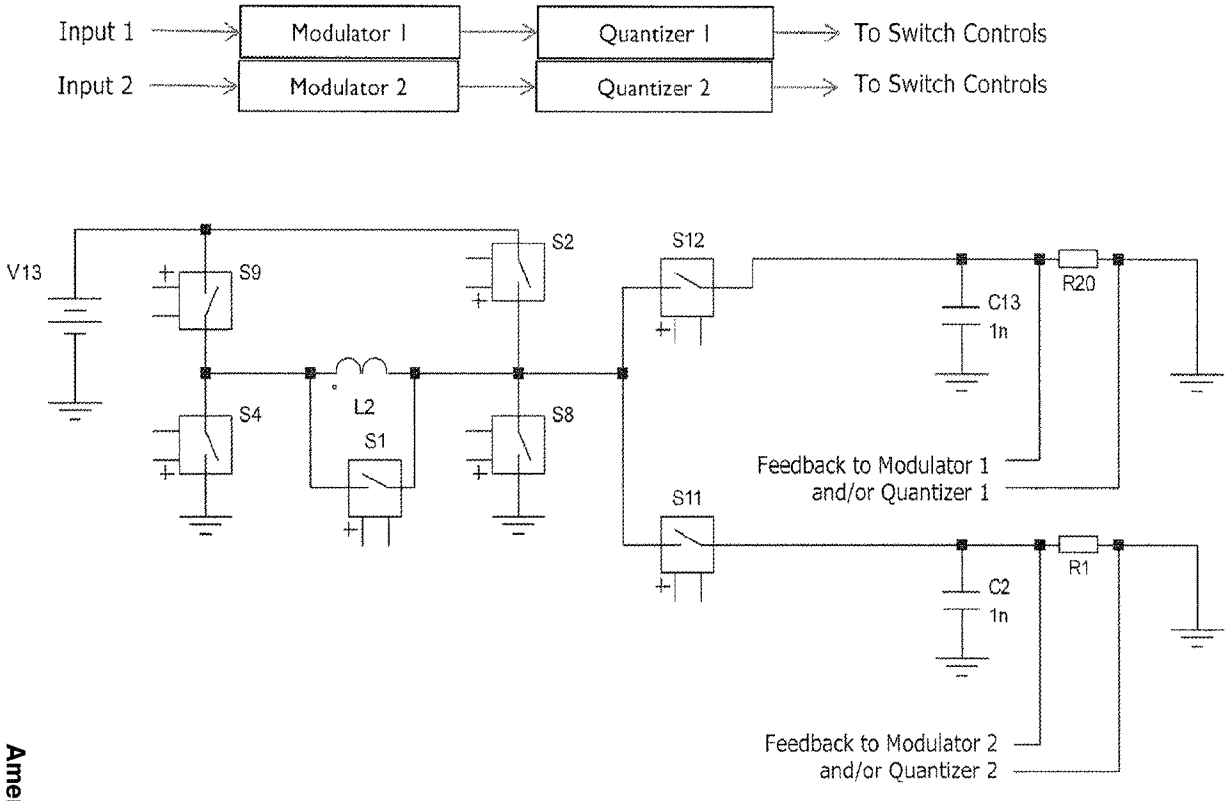
Figure 1 Prior Art
FIG. 1 is schematic block diagram of an example of a previous design of a SIMO stereo headphone amplifier.

A preliminary implementation of an SIMO amplifier is shown in FIG. 1. As herein described the components as numbered correspond to specific claim elements. This embodiment of the SIMO amplifier is not implemented in this form due to instability issues when instantiated as dual amplifiers. In this design, the inductor L2 is charged by supply V13 in a positive or negative direction. This is done by turning on switch S9 with switch S8 for a positive charge or switch S2 with switch S4 for a negative charge. After charging the inductor L2, it is discharged by turning on S4 and switch S12 so that L2 discharges into capacitor C13 and load R20. Then the residual inductor current is retained by turning on switch S1. Next, another charge cycle occurs and a second discharge occurs by turning on S4 and switch S11 so that the L2 discharges into capacitor C2 and load R1. Then S1 is turned on again to hold the inductor current. The total cycle is then repeated. Feedback across both loads is fed back to modulators (and quantizers) which control the switches. Instability issues due to residual inductor current coupling between stereo channels is what has prevented actual implantation of the design.

Figure 2:
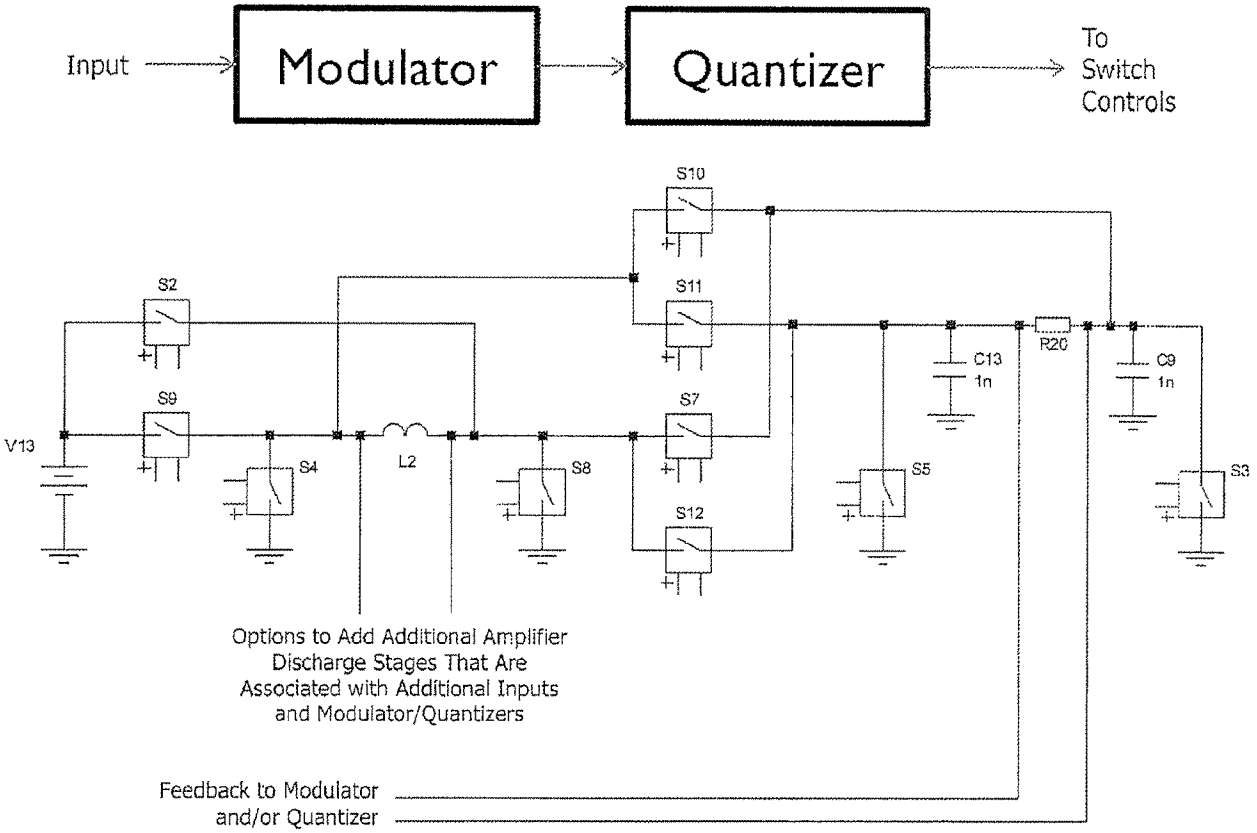
FIG. 2 is a generalized circuit diagram of a device with a shared function inductor according to the invention.

A generalized version of the new art is shown in FIG. 2. A switch controller of conventional design is not shown for clarity. Switch controls are included to operate the switches in accordance with the invention as herein explained. An input signal is applied to a modulator; the output of the modulator feeds a quantizer, which may be viewed as part of the modulator. The quantizer drives several switches which are connected as shown and herein described to an inductor L2 and a load R20. The load may have filtering capacitors C9, C13 connected to its terminals (herein shown as connected to ground; however they can be across the load). The signal across the load is fed back to both the modulator and the optionally the quantizer as part of the amplifier feedback (full path not shown).

The modulator and quantizer can be implemented in many ways without differing from this new art. Sometimes the modulator may use noise shaping and sometimes it is not. Sometimes the control uses PWM and sometimes PDM or another modulation scheme. Sometimes the time steps are discrete and sometimes they are not. There are many ways to control the switches and these are intended to be included in the new art.

Specifically referring to FIG. 2, the load R20 has a first load terminal (left) and a second load terminal (right), a first feedback path from the first load terminal to the modulator and optionally the quantizer, and a second feedback path from the second load terminal to the modulator and optionally the quantizer. The quantizer is operationally coupled to control opening and closing of the plurality of switches directing power through the inductor L2 and the load R20 and is responsive to output of the modulator which in turn is responsive to a signal input to the modulator.

Further, the inductor L2 has a first terminal (left) and a second terminal (right) and the plurality of switches are arranged as follows: a second switch S2 is coupled between the second inductor terminal and a D.C. power source V13, a third switch S3 is coupled between the second load terminal and ground, a fourth switch S4 is coupled between the first inductor terminal and ground, a fifth switch S5 is coupled between the first load terminal and ground, a seventh switch S7 is coupled between the second inductor terminal and the second load terminal; an eighth switch S8 is coupled between the second inductor terminal and ground, a ninth switch S9 is coupled between the first inductor terminal and D.C. power source V13, a tenth switch S10 is coupled between the first inductor terminal and the second load terminal, an eleventh switch S11 is coupled between the first inductor terminal and the first load terminal, and a twelfth switch S12 is coupled between the second inductor terminal and the first load terminal. As bypass, first capacitor C13 is coupled between the first load terminal and ground and second capacitor C9 is coupled between the second load terminal and ground. This circuit forms a reconfigurable resource around the inductor L2 and the load R10 as now explained.

The operation of the switches involves a first phase of charging the inductor L2 by turning on both S9 and S8. An alternate way of charging L2 is to turn on S2 and S4 to produce an inductor current that is of the opposite polarity. Then the current built up in the inductor L2 is fully or partially released into the load R20 through S7 and S11 or through S12 and S10. A second method to discharge is to turn on S4 and one of S7 with S5 or S12 with S3. A third method to discharge is to turn on S8 and one of S10 with S5 or S11 with S3. A fourth method to discharge is to turn on S9 and S7 with S5 or S12 with S3. A fifth method of discharge is to turn on S2 and S10 with S5 or S11 with S3. The fourth and fifth methods of discharging allows for maximum power transfer to the load R20 because the voltage on the inductor L2 is raised up by the power source V13. It is a good way to provide for voltage boosting. After the discharge phase if only one amplifier is on, the residual inductor current (if any) can be retained by shorting the inductor L2 by turning on S4 and S8 or by turning on S2 and S9. An additional switch S1 could also be added and used but it is not needed. If more than one amplifier is used at the same time, the residual current is zeroed by opening all switches connected to L2 to let the parasitic switch diodes clamp the inductor terminals which is important to prevent loss of stability that could be caused by crosstalk between the amplifiers from the residual inductor current. Additional loads with switches to allow discharge from the inductor can be connected to either terminal of L2 to allow sharing of S2, S9, S4 and S8.

In an alternate mode of operation, either S7 and S5 or S12 and S3 are turned on and held on. Then S4 and S9 alternate (depending on the control signal from the quantizer) to produce a Class D switching waveform. This switching pattern passes through and is filtered by inductor L2, either S7 or S12, and C13 or C9 (depending on which switch was on). This produces a conventional Class D amplifier mode of operation. By alternating the on states of pair S7 and S5 versus pair S12 and S3, the Class D pattern can change which side of the load that is being driven. Because only the differential signal is fed back to the modulator and possibly the quantizer, the differential output signal can be made to be linear. The appearance on each half of the load is a filtered output that appears as a rectified version of the input signal. The differential signal not rectified and it is also filtered, allowing for this alternating Class-D mode of operation.

Unlike a conventional Class-D operational mode, this mode of operation is able to go beyond the rail voltage. When discharging to both load terminals using S10 and S11 or using S7 and S12 this happens naturally. Using the above rectified approach, an additional clarification on the operation of the switches is provided here. After operating S4 and S9 as a Class-D amplifier, an additional mode is turned on to operate beyond V13 when the output signal gets close to the voltage provided by V13. In this mode, S9 is held on and S8 is alternated with either S7 (while S5 is held on) or S12 (while S3 is held on). This allows the output signal to go beyond the voltage supplied by V13. More detail is provided in subsequent examples. Note that the inductor value, capacitor values and supply voltage values provided may be changed in various embodiments. Also, the symmetry of the switches is intended to be covered by this new art. For example in boost mode, S2 could be held on while S4 and S10 (S5 held on) or S11 (S3 held on) were alternated.

Any of these modes can be joined together sharing the same charging inductor L2 and sharing S2, S9, S4 and S8.

Below are some examples of the invention with explanations of operation. An understanding of the configuration and operation is assumed of Class AB amplifiers, Class D regulators and amplifiers (various architectures and for both bridged and single ended configurations), SIMO regulators, continuous and discontinuous modes of operation for switching amplifiers, amplifier technology, audio technology and sigma delta converter concepts. Additional circuitry such as protection diodes are also needed in these examples but not shown in some cases for simplification purposes.

The switch configurations in FIG. 2 have redundancy and can be simplified depending on the application as will be illustrated in the examples below. In addition to connecting the signal to both terminals of a load, the inductor can be switched to different loads. This can be done by time-alternating so that all loads have filtered signals at the same time. This can also be done by mode-alternating so that the inductor is connected to different loads when another load is turned off. Some of these are illustrated in the examples below.

Example 1

Stereo High Efficiency Headphone Amplifiers Plus One Extra DC Supply

Figure 3:
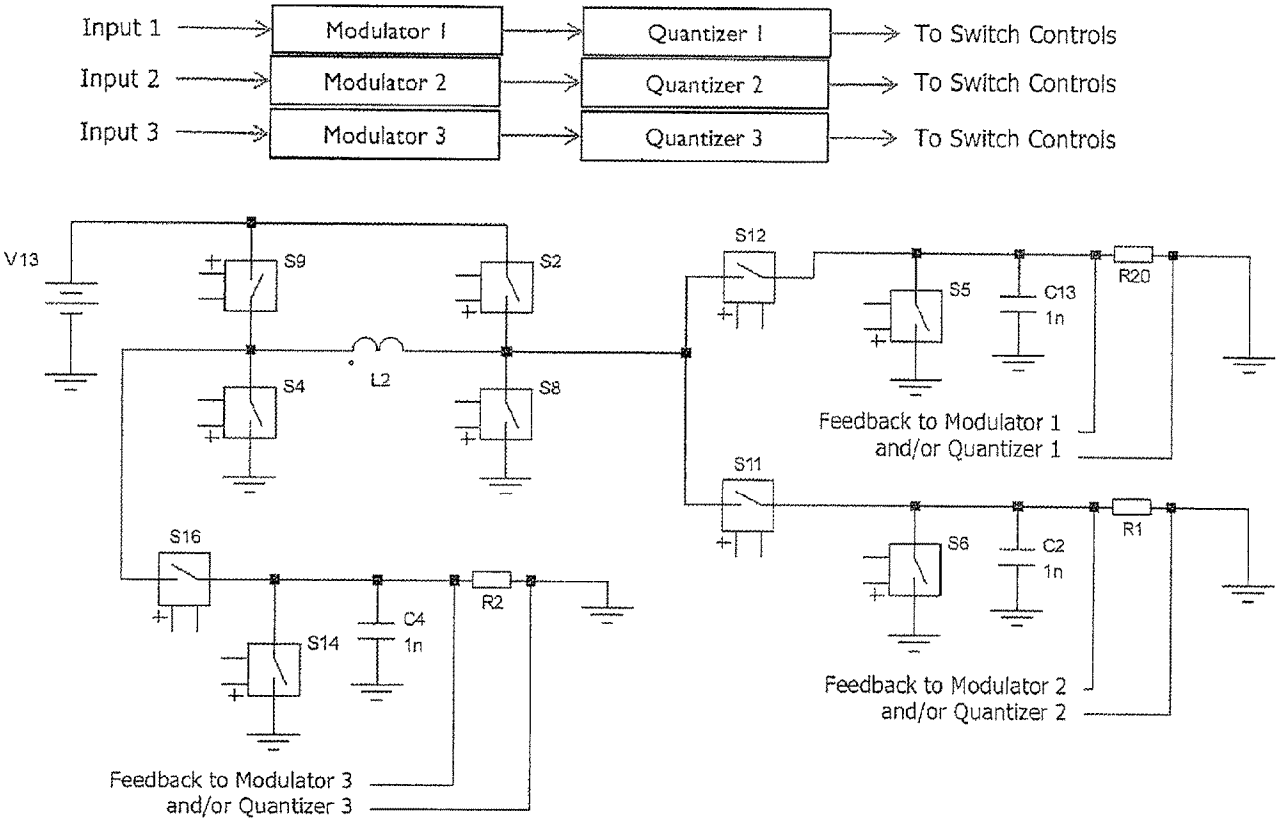
FIG. 3 shows a schematic of the output stage of a stereo audio headphone amplifier plus DC-DC converter incorporating the invention.

FIG. 3 show the power stage for a ground-centered stereo audio headphone amplifier with an extra DC supply. In this example, the amplifier charges the inductor and then discharges into load 1 (R20). Then it charges the inductor again and then discharges into load 2 (R1). Finally, it charges the inductor and discharges into load 3 (R2). Then this cycle repeats starting over back at load 1.

In this example, the charging is done by S9, S4, S2 and S8. These switches are shared between all of the outputs. The inductor can be charged in either polarity by either closing S8 and S9 or by closing S2 and S4.

Discharging depends on which load is being used. For R20, in this example, discharging is done by turning on S4 and either S7 or S12 with S5 and S3 respectively. For R20, in this example, discharging is done by turning on S4 and S12. For R1, in this example, discharging is done by turning on S4 and S11. For R2, in this example, discharging is done by turning on S8 and either S16. Unlike the configuration shown in FIG. 1, there is no switch S1. Instead of using a switch across the inductor which causes problematic cross-coupling between the channels, S9, S4, S2 and S8 are opened for a portion of the clock at the end of each cycle to fully discharge the inductor and remove any memory in the form of inductor current between the different amplifiers. The switches are naturally implemented with power FETs that have diodes to the supply or ground. Those diodes recirculate most of the remaining inductor current to the supply. Schottky diodes or controlled switches in a similar configuration to the FET parasitic diodes could have been used to reduce the series loss with the parasitic diodes without differing from the new art.

The inductor charging switches can be shared with other amplifiers. If these amplifiers are off when that sharing occurs, switches S5, S11 and S14 are provided as optional switches that can be used to prevent coupling through the parasitics of S12, S11, or S16 when L2 is being used for other purposes.

Figure 4:
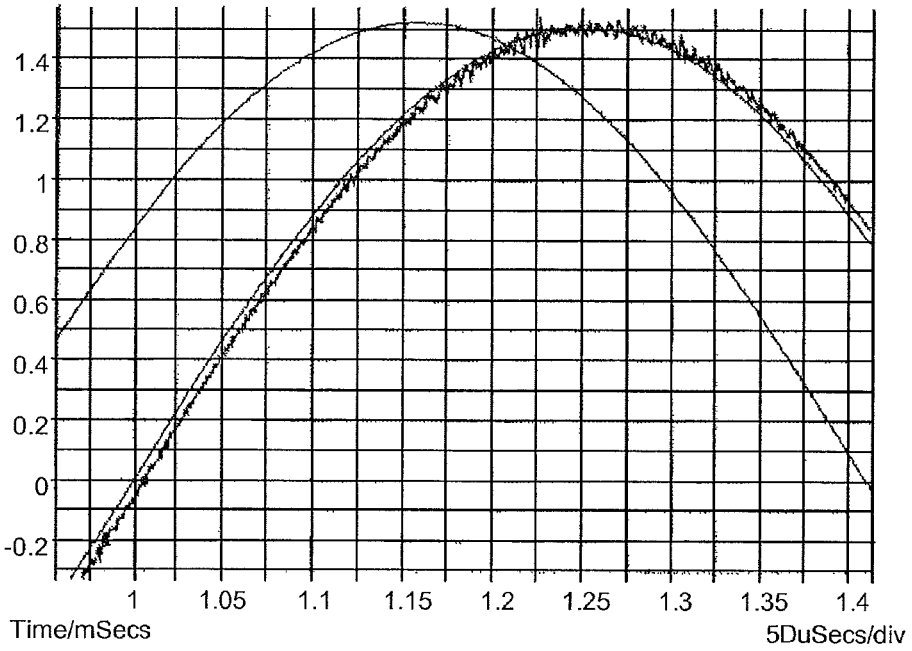
FIG. 4 is a graph of input voltage vs. output voltage for a portion of a sinusoid for the circuit of FIG. 3.
Figure 5:
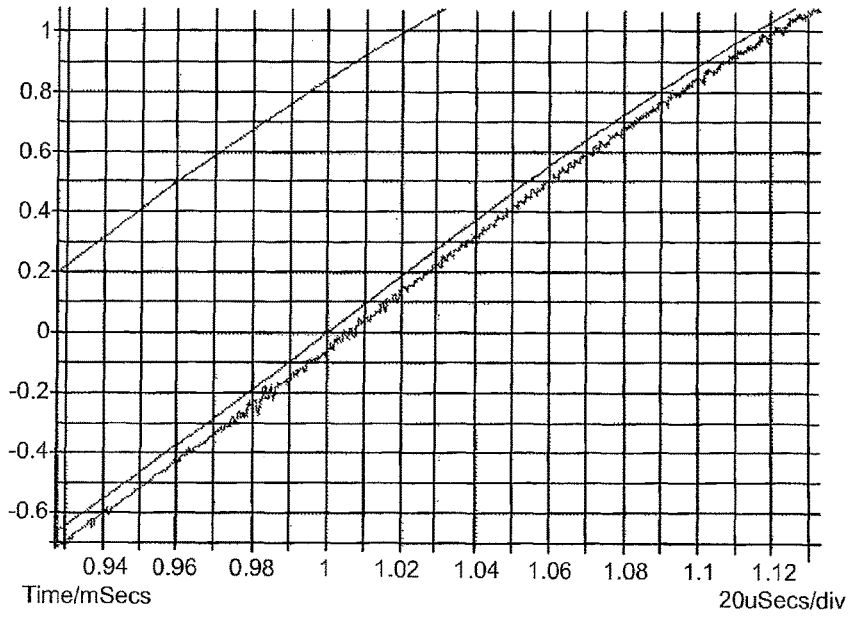
FIG. 5 is a graph of input voltage vs. output voltage during signal operation passing through zero volts.
Figure 6:
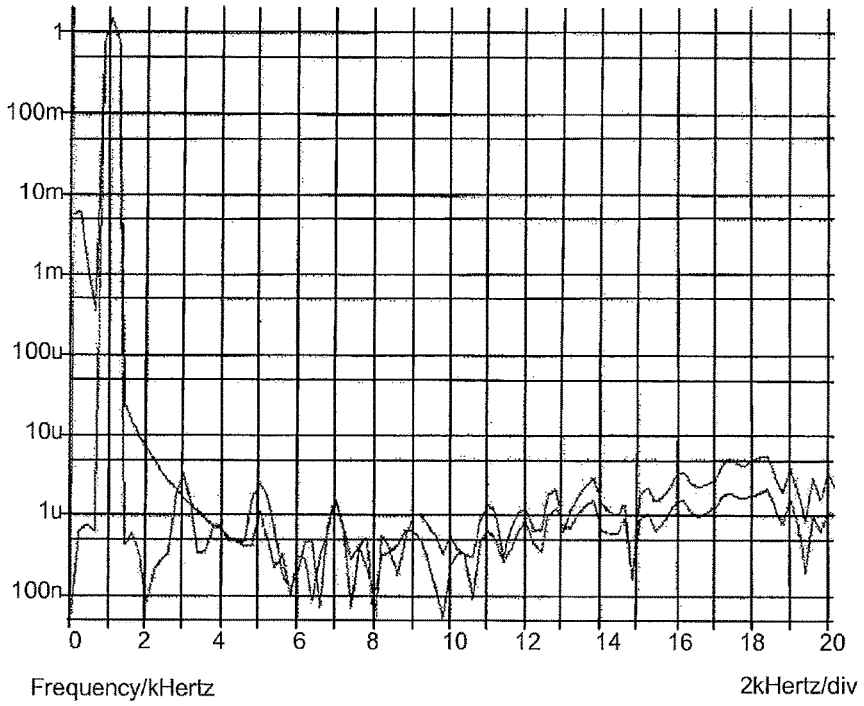
FIG. 6 is a graph of an FFT of output voltage.

The amplifier has three outputs: two for headphones and one DC-DC output which were modeled by resistors R20, R1 and R2 respectively in this example. FIGS. 4, 5 and 6 show examples of the types of performance that were achieved with this invention for the one of the headphone outputs. FIG. 4 shows two input voltages and one output voltage of a headphone example from zero to peak. FIG. 5 shows both input voltages and one output voltage of a headphone example as a signal passes through 0V. FIG. 6 shows the Fast Fourier Transform (FFT) of one of the output voltages and A-weighted output voltage of the headphone example. The FFT bin sizes are 200 Hz so this A-weighted SNR is greater than 100 dB. The A-weighted low frequency increase is simply due to the time-domain transient at startup.

Example 2

Bridged High Efficiency Amplifier Using One Inductor with Ability for Output Voltages to Exceed Supply Terminals (VCC and/or GND)

With this new art architecture, as implemented in Example 1, the inductor current can get quite high causing significant power dissipation in the amplifier. For example, even when operating in continuous boost mode, if the inductor is connected to the load 50% of the time, the average current can be approximately 2× the load current. If the inductor is cycled between many loads then the peak inductor currents can get quite high because the inductor is typically connected to the load for a small percentage of each cycle and the inductor is usually fully discharged in order to reduce crosstalk between channels. This is acceptable for loads with small output currents such as headphones but it is desirable to change this for high output power loads. Therefore, when alternating clock cycles are not being used to share the inductor with other channels as was done in Example 1, it is better to use the amplifier in continuous mode which raises efficiency of the overall amplifier. Continuous mode can be used at the peaks or other portions of the signal as needed.

The circuitry allows for the inductor discharge phase to switch to both terminals of the load at the same time or independently. In FIG. 2, both terminals of the load are driven when discharging is done with S10/S11 or S7/12. Independent load terminals are driven when the discharge path uses only one switch coupled to the inductor and S3 or S5 to ground the other terminal.

An advantage of this type of amplifier over a Class D amplifier is that it is not limited by the supply voltages. Both techniques for driving the load (driving both terminals or driving the terminals independently) can go beyond the supply voltages but driving the terminals independently requires more clarification. Using the subset of switches from FIG. 2 that are shown in FIG. 7, an enhanced output was produced.

Figure 7:
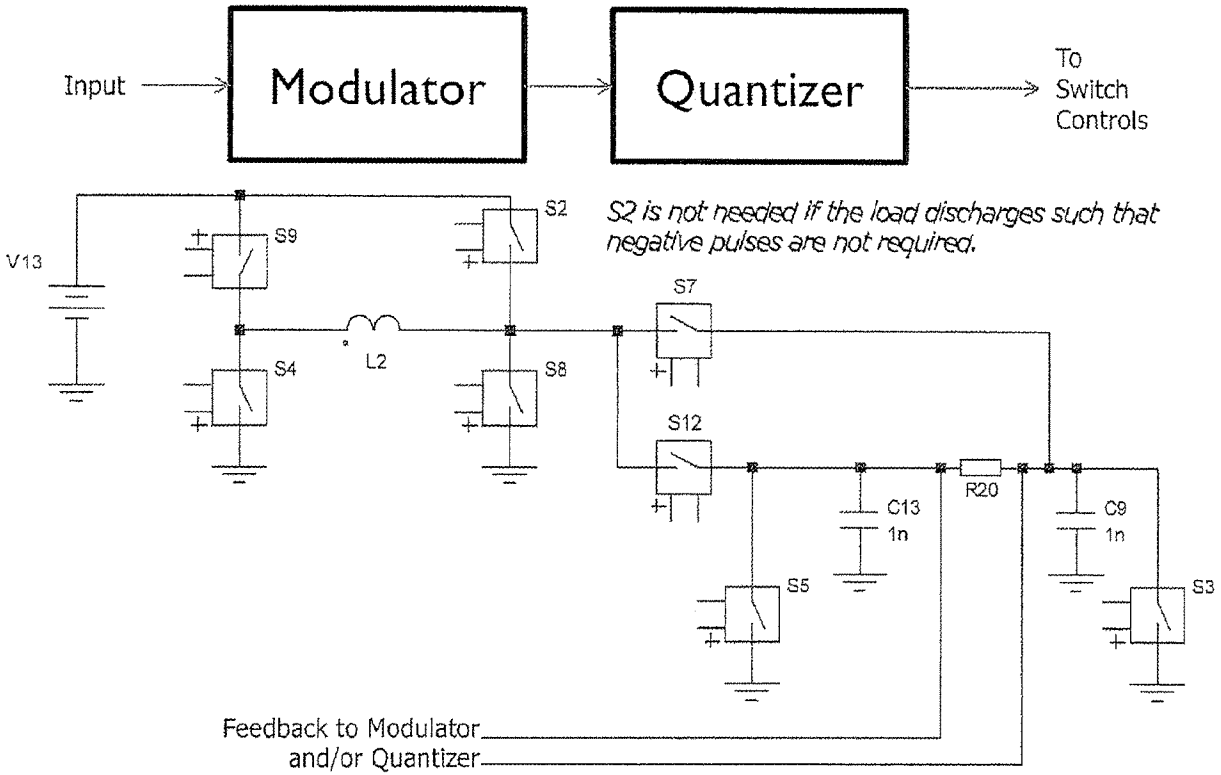
FIG. 7 is a simplified version of FIG. 2 for an example of the technology.

Following the numbering of FIG. 7, the plurality of switches comprise a second switch coupled between the second inductor terminal and a D.C. power source, a third switch coupled between the second load terminal and ground, a fourth switch coupled between the first inductor terminal and ground, a fifth switch coupled between the first load terminal and ground. a seventh switch coupled between the second inductor terminal and the second load terminal, an eighth switch coupled between the second inductor terminal and ground, a twelfth switch coupled between the second inductor terminal and the first load terminal, a first capacitor coupled between the first load terminal and ground; and a second capacitor coupled between the second load terminal and ground.

The inductor charging phase is done with switch S9 and switch S8 or alternately with switch S2 and switch S4. Discharging in this example depends on if you are below the rail (V13) or crossing/above the rail (V13). Below the rail, S4 and S9 are alternated and either switch S7 with switch S5 are turned on or S12 with S3 are turned on. To cross the voltage on V13 and to go beyond the voltage on V13, S9 is turned on. Then S8 is alternated with S7 or S12. If S7 is alternated with S8 then S5 is held on. If S12 is alternated with S8 then S3 is held on.

Figure 8:
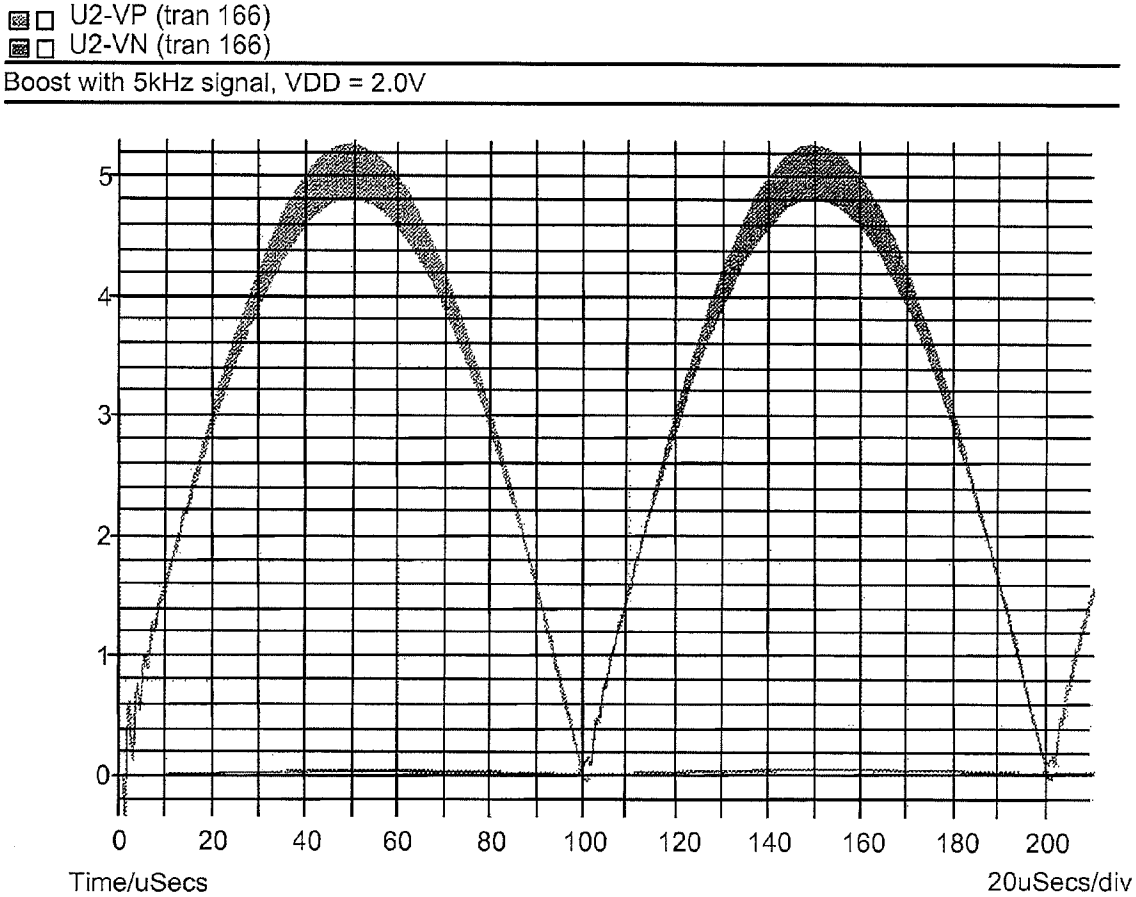
FIG. 8 is a graph of the output waveforms of the amplifier of FIG. 7.

In FIG. 8 time domain output waveforms are shown with bridged amplifier with a 2V power supply and ground. In this example, the amplifier changed to non-continuous mode to achieve zero crossings but it can also remain in continuous mode for zero crossings.

The resulting single-ended load output terminal signals look like rectified versions of the input signal. The differential signal, however, is a clean sinusoid and the differential feedback removes the common mode components and insures linearity.

When the signal reaches the applied supply rail, Class D amplifiers have difficulty and clip. The present configuration of circuitry can reach the rail and go beyond with high efficiency.

Figure 12:
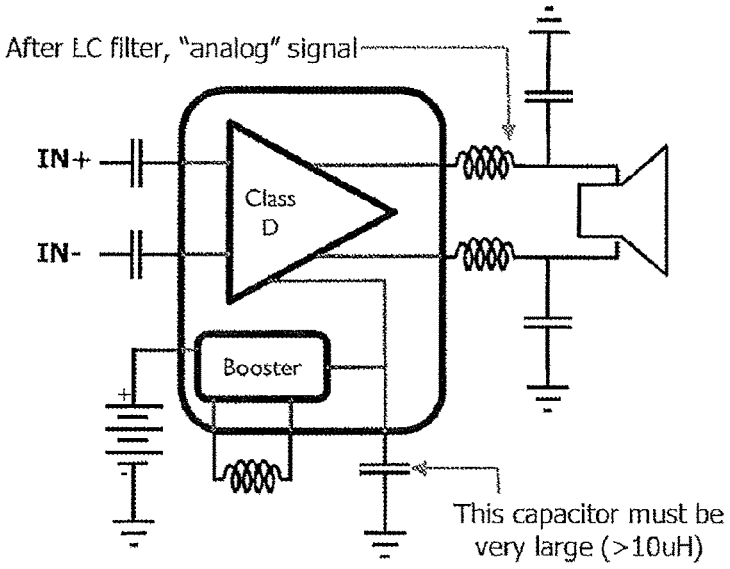
FIG. 12 is a schematic to illustrate the prior art BOM and block diagram for a boosted application.
Figure 13:
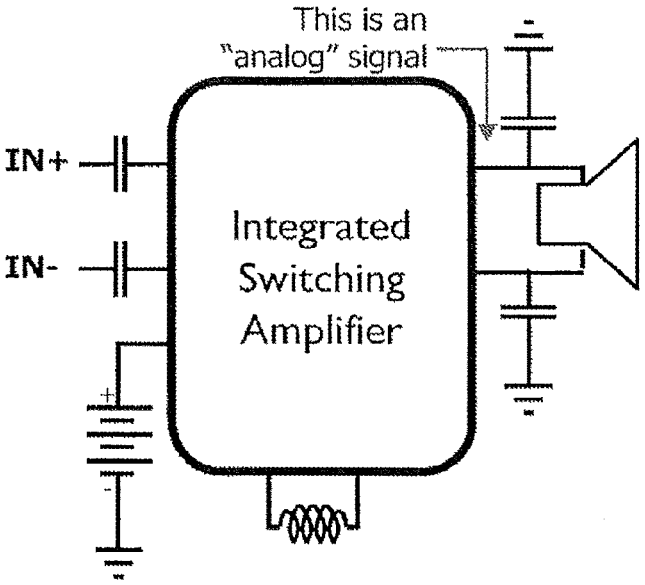
FIG. 13 is a schematic diagram of BOM advantage according to the invention versus FIG. 12 based on the example of FIG. 7.

Conventional class D amplifiers require two inductors to filter the two bridged outputs. In addition, a third inductor is often required to boost the supply if a higher voltage is desired to prevent clipping. According to the present invention, a bridged output waveform can be implemented with only one inductor and is able to go beyond the available supply voltage. The BOM benefits of this new approach versus the traditional approach are compared in FIG. 12 versus FIG. 13.

In FIGS. 7, S2, S8, S9 and S4 can also be shared with additional amplifiers by adding additional switches similar to what was done in FIG. 3. Some outputs can be simultaneously on by sharing different phases of the clock and others can be turned on independently to operate in a higher efficiency continuous mode.

Example 3

Shared High Efficiency Bridged Amplifier with Either Above Headphones or Supply Rails for Class AB, Class G or Class H Headphones In a cell phone, the high power amplifier and the headphone amplifier are rarely (if ever) used at the same time. The inductor can therefore be used for both purposes (both previous examples can share an inductor). If both are on, modulator stability may require that the high power speaker amplifier operate in a mode not using the inductor such as by adding an additional class AB amplifier.

Many new cellphones are adopting an architecture where the headphone is powered by added positive and negative supply voltages. The inductor can also be used to generate these rails (similar to first example but simply outputting fixed DC output voltages).

Example 4

Discharging to Both Load Terminals

Figure 9:
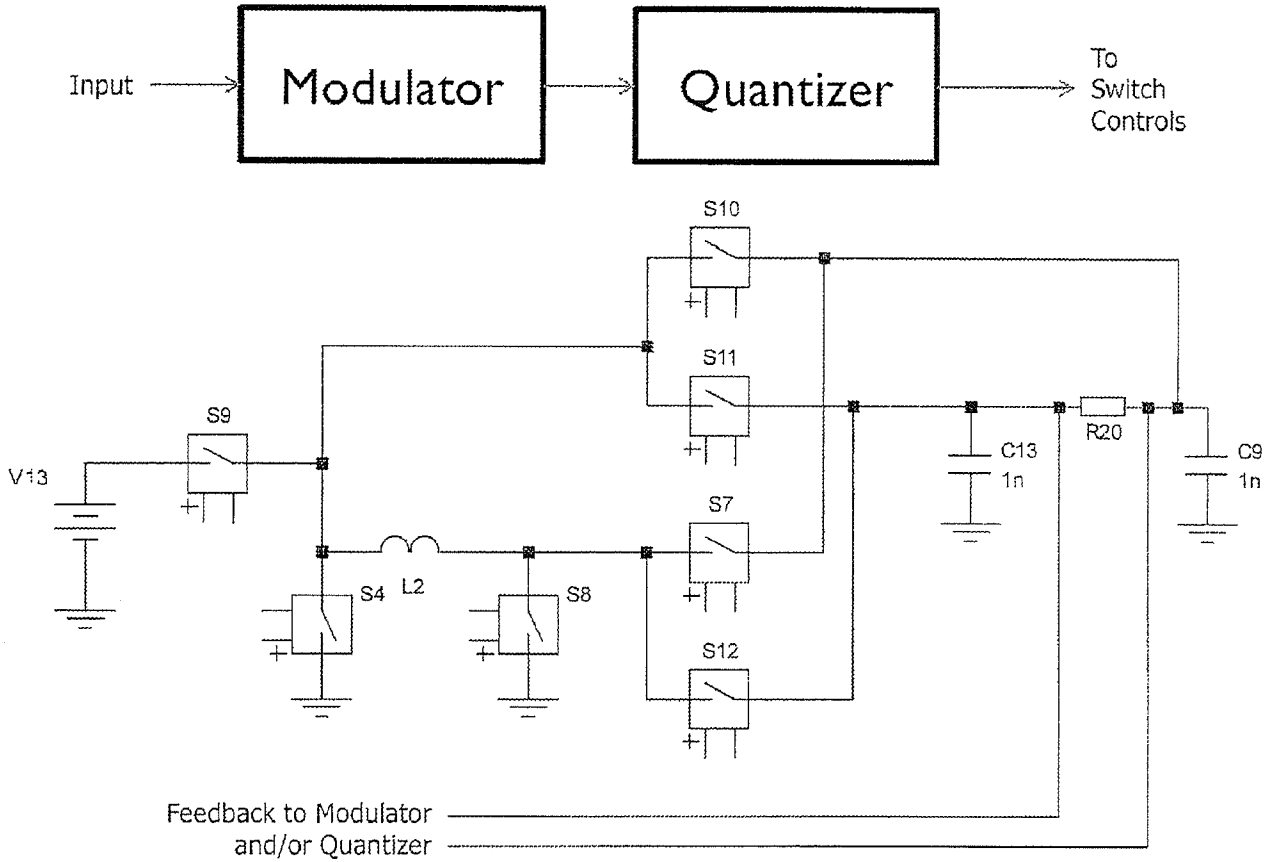
FIG. 9 is a diagram of an output stage of an embodiment where both terminals of the load are driven at the same time.

It is also possible to discharge to both load terminals. An example of this approach is shown in FIG. 9. Following the component numbering of FIG. 9, the plurality of switches comprise a fourth switch coupled between the first inductor terminal and ground, a fifth switch coupled between the first load terminal and ground, a seventh switch coupled between the second inductor terminal and the second load terminal, an eighth switch coupled between the second inductor terminal and ground, a ninth switch coupled between the first inductor terminal and a D.C. power source, a tenth switch coupled between the first inductor terminal and the second load terminal, an eleventh switch coupled between the first inductor terminal and the first load terminal, a twelfth switch coupled between the second inductor terminal and the first load terminal, a first capacitor coupled between the first load terminal and ground, and a second capacitor coupled between the second load terminal and ground.

In this embodiment, the modulator, quantizer and feedback elements behave similarly to previous examples. Also in this embodiment, inductor L2 is always charged in the same direction using switches S9 and S8 and the supply V13. The inductor L2 is then discharged across the load R20 and capacitors C13 and C9 using switches S7 and S12 or using switches S10 and 11. After discharging the inductor current can be ignored by immediately going back to the charge phase, it can be fully discharged by opening all switches, or it can be saved by turning on S4 and S8. The common mode on the terminals of R20 can be controlled using many techniques for one skilled in the art and that information is not shown here.

Figure 10:
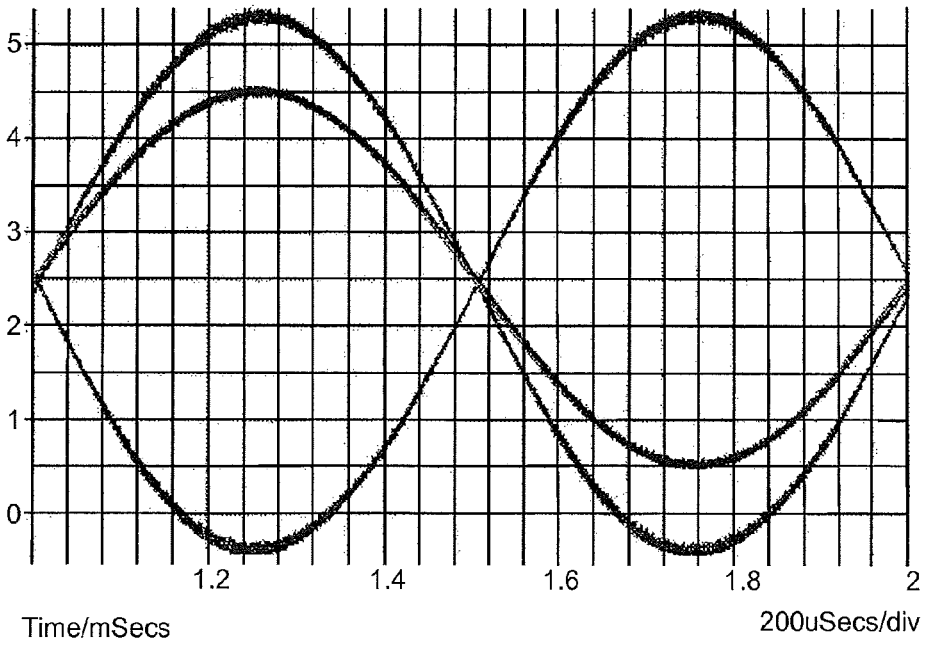
FIG. 10 is a graph of the input-output waveforms of the circuit from FIG. 9.
Figure 11:
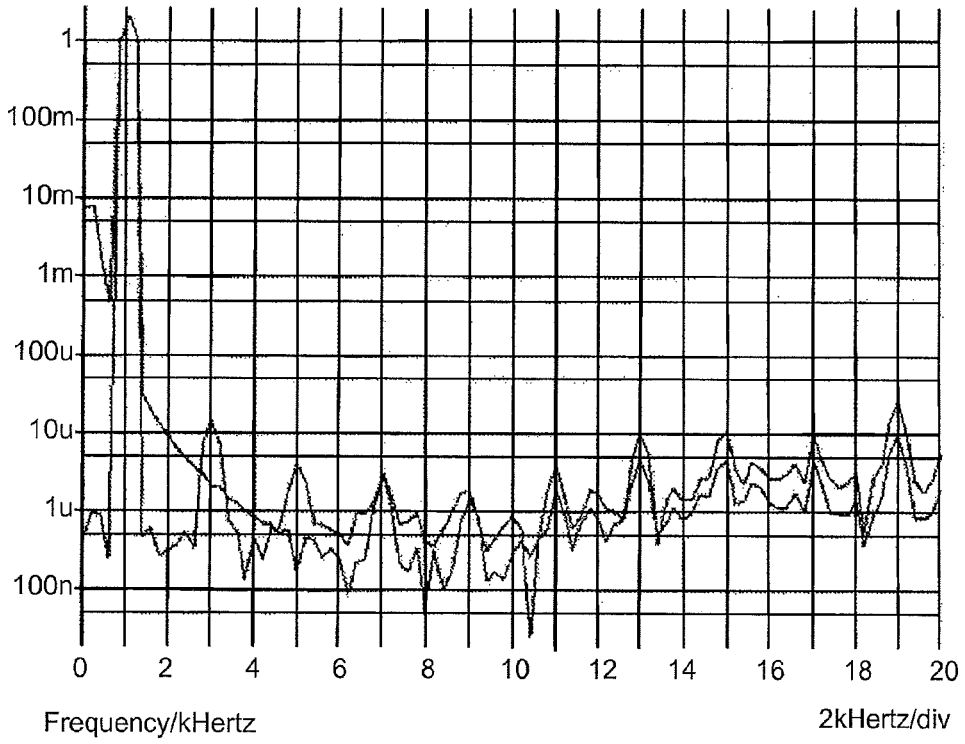
FIG. 11 is graph of a frequency domain result from the circuit in FIG. 9.

The approach in this embodiment is capable of going beyond the voltage provided by V13 and it is also capable of going below ground. Using this approach and saving the residual current with a technique similar to turning on S4 and S8, the results shown in FIG. 10 (input and outputs are shown) and FIG. 11 (FFT) were achieved. V13 was connected to 0V and provided a 5V output so this output waveform went beyond both rails.

Some of the difference between the present invention and the known prior art are listed below:

1. Use of one inductor for more than one purpose, where at least one purpose or use is for signal amplification where the output inductor is opened for a portion of the cycle to erase the inductor memory when more than one amplifier is used at the same time.
2. Sharing more than one inductor for resource sharing across multiple loads when the some of the loads are off (a straightforward extension of the examples).
3. Sharing one inductor with both load terminals.
4. Using a shared or single inductor amplifier to produce filtered output signals that exceed the supply voltages (either VCC or GND).
5. Changing between having two or more of the following modes active for different signal output levels:
   - mode 1—Using only discharge cycles connected to the load (charging disconnected from load);
   - mode 2—Using both charge and discharge cycles connected to load (class D mode);
   - mode 3—Using discharge cycles connected to load and a power supply.
6. Switching between the 2+ above modes using the same inductor for different loads.
7. Full wave rectifying the output signal (or nearly-so) and using the 2+ above modes at different portions of the output signal.
8. Putting a switch between the inductor and the load and having a switch on the other side of the load to a fixed voltage (e.g. −GND).

The above points are not intended to be a limitation on the invention but simply a highlighting of some features. Variations are possible and intended to be included. Some examples are variations on the modulator and/or quantizer designs, variations in how the charging/discharging is implemented and the process technology used to implement the circuitry. Additional variations are possible in the location of the feedback signals, the timing of the inductor charge and discharge cycles and so forth. The examples above are intended to be illustrative in nature. Also, most of the examples in this document were audio-specific but this type of technology is applicable to many different forms of amplification such as motor drivers.

What is claimed is:

1. A circuit [device] having a load with a first load terminal and a second load terminal, *the circuit* comprising:

[at least one] *an* inductor *having a first inductor terminal and a second inductor terminal*;

a plurality of controllable switches coupled to the inductor and the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

a modulator [element];

a first feedback path from the first load terminal to the modulator [element];

a second feedback path from [a] *the* second load terminal to the modulator [element];

wherein the modulator [element] is operationally coupled to control opening and closing of the plurality of switches directing power through the inductor and through the load;

wherein the modulator [element] is responsive to an input signal to the modulator [element]; and wherein the modulator [element] includes a quantizer.

2. The [amplifier] circuit [device] of claim 1 wherein the plurality of switches comprises:

a second switch coupled between the second inductor terminal and a [D.C.] *DC* power source;

a third switch coupled between the second load terminal and ground;

a fourth switch coupled between the first inductor terminal and ground;

a fifth switch coupled between the first load terminal and ground;

a seventh switch coupled between the second inductor terminal and the second load terminal;

an eighth switch coupled between the second inductor terminal and ground;

a ninth switch coupled between the first inductor terminal and the DC power source;

a tenth switch coupled between the first inductor terminal and the second load terminal;

an eleventh switch coupled between the first inductor terminal and the first load terminal;

a twelfth switch coupled between the second inductor terminal and the first load terminal;

a first capacitor coupled between the first load terminal and ground; and a second capacitor coupled between the second load terminal and ground;

the circuit forming a reconfigurable resource around the inductor.

3. The circuit [device] of claim 1 wherein the inductor is used in signal amplification and is alternately coupled among multiple load terminals using the switches.

4. The circuit [device] of claim 1 wherein the inductor is used in signal amplification and is alternately coupled among multiple loads using the switches.

5. A circuit [device] having a load with a first load terminal and a second load terminal, *the circuit* comprising:

[at least one] *an* inductor;

a plurality of controllable switches coupled to the inductor and the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

a modulator [element];

a first feedback path from the first load terminal to the modulator [element];

a second feedback path from a second load terminal to the modulator [element];

wherein the modulator [element] is operationally coupled to control opening and closing of the plurality of switches directing power through the inductor and through the load;

wherein the modulator [element] is responsive to an input signal to the modulator [element]; and wherein the circuit [device] is a signal amplifier and wherein levels of output signals exceed supply voltage during charge and discharge cycles.

6. The circuit [device] of claim 1, wherein the circuit [device] is a rectifying bridged amplifier having two load terminals, the inductor being switchable to drive each of the two load terminals without distortion.

7. A circuit [device] having a load with a first load terminal and a second load terminal, *the circuit* comprising:

[at least one] *an* inductor;

a plurality of controllable switches coupled to the inductor and the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

a modulator [element];

a first feedback path from the first load terminal to the modulator [element];

a second feedback path from a second load terminal to the modulator [element];

wherein the modulator [element] is operationally coupled to control opening and closing of the plurality of switches directing power through the inductor and through the load;

wherein the modulator [element] is responsive to an input signal to the modulator [element];

wherein the circuit [device] is a rectifying bridged amplifier having two load terminals, the inductor being switchable to drive each of the two load terminals without distortion; and wherein the circuit [device] receives a portion of a signal from [an] *the* inductor on the first load terminal while the second *load* terminal is coupled to ground and receives a separate portion of a signal from [an] *the* inductor on the second load terminal while the first *load* terminal is connected to ground.

8. A circuit [device] having a load with a first load terminal and a second load terminal, *the circuit* comprising:

[at least one] *an* inductor *having a first inductor terminal and a second inductor terminal*;

a modulator;

a first feedback path from the first load terminal to the modulator;

a second feedback path from the second load terminal to the modulator;

a plurality of controllable switches coupled to the inductor and the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

wherein the modulator is operationally coupled to control opening and closing of the plurality of switches directing power through the inductor and through the load;

wherein the modulator is responsive to an input signal to the modulator;

wherein the plurality of switches comprise a third switch coupled between the second load terminal and ground;

a fourth switch coupled between the first inductor terminal and ground;

a fifth switch coupled between the first load terminal and ground;

a seventh switch coupled between the second inductor terminal and the second load terminal;

an eighth switch coupled between the second inductor terminal and ground;

a ninth switch coupled between the first inductor terminal and a D.C. power source;

a twelfth switch coupled between the second inductor terminal and the first load terminal;

a first capacitor coupled between the first load terminal and ground; and a second capacitor coupled between the second load terminal and ground; the circuit forming a reconfigurable resource around the inductor.

9. A circuit [device] having a load with a first load terminal and a second load terminal, *the circuit* comprising:

[at least one] *an* inductor *having a first inductor terminal and a second inductor terminal*;

a modulator;

a first feedback path from the first load terminal to the modulator;

a second feedback path from the second load terminal to the modulator;

a plurality of controllable switches coupled to the inductor and to the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

wherein the modulator is operationally coupled to control opening and closing of the plurality of switches directing power through the inductor and through the load;

wherein the modulator is responsive to an input signal to the modulator;

wherein the plurality of switches comprise a fourth switch coupled between the first inductor terminal and ground;

a seventh switch coupled between the second inductor terminal and the second load terminal;

an eighth switch coupled between the second inductor terminal and ground;

a ninth switch coupled between the first inductor terminal and a D.C. power source;

a tenth switch coupled between the first inductor terminal and the second load terminal;

an eleventh switch coupled between the first inductor terminal and the first load terminal;

a twelfth switch coupled between the second inductor terminal and the first load terminal;

a first capacitor coupled between the first load terminal and ground; and a second capacitor coupled between the second load terminal and ground;

the circuit forming a reconfigurable resource around the inductor.

10. The circuit [device] of claim 8 further including a second switch coupled between the second inductor terminal and a [D.C.] *DC* power source.

11. A circuit [device] having a load with a first load terminal and a second load terminal, *the circuit* comprising:

[at least one] *an* inductor;

a plurality of controllable switches coupled to the inductor and the load, said switches for routing paths through the load and the inductor, the switches being [configured to allow the inductor to serve a plurality of circuit functions such that the inductor is a pooled resource while producing an output signal] *arranged to be controlled in a plurality of different modes to produce an output signal, wherein the plurality of different modes include (i) different modes for charging the inductor and (ii) different modes for discharging the inductor*;

a modulator [element];

a first feedback path from the first load terminal to the modulator [element];

wherein the modulator [element] is operationally coupled to control opening and closing of the plurality of switches directing power through the inductor and through the load;

wherein the modulator [element] is responsive to an input signal to the modulator [element]; and wherein the modulator [element] includes a quantizer, *and*

*wherein the inductor is used in signal amplification and is alternately coupled among multiple load terminals using the switches.*

[12. The circuit device of claim 11 wherein the inductor is used in signal amplification and is alternately coupled among multiple load terminals using the switches.]

[13. The circuit device of claim 11 wherein the inductor is used in signal amplification and is alternately coupled among multiple loads using the switches.]

*14. An amplifier, comprising:*

*an inductor having a first inductor terminal and a second inductor terminal;*

*a plurality of switches arranged to generate a switching waveform in response to (i) a control signal and (ii) a current provided by the inductor;*

*a load having a first load terminal and a second load terminal, wherein the load outputs an amplified signal based on (i) an input signal to be amplified by the amplifier and (ii) the switching waveform,*

*wherein, to generate the switching waveform, the plurality of switches are selectively controlled by the control signal to*

*provide a first path from at least one of the inductor and a power source to at least one of the first load terminal and the second load terminal of the load, and*

*provide a second path from at least one of the inductor and the power source to at least one of the first load terminal and the second load terminal of the load; and*

*a modulator that receives the input signal and generates the control signal based on the input signal,*

*wherein the modulator receives feedback from the load and generates the control signal further based on the feedback.*

*15. The amplifier of claim 14, wherein the switching waveform is a class D switching waveform.*

*16. The amplifier of claim 14, wherein the modulator receives the feedback via a first feedback path from the first load terminal and a second feedback path from the second load terminal.*

*17. An amplifier, comprising:*

*an inductor having a first inductor terminal and a second inductor terminal;*

*a plurality of switches arranged to generate a switching waveform in response to (i) a control signal and (ii) a current provided by the inductor; and*

*a load having a first load terminal and a second load terminal, wherein the load outputs an amplified signal based on (i) an input signal to be amplified by the amplifier and (ii) the switching waveform,*

*wherein, to generate the switching waveform, the plurality of switches are selectively controlled by the control signal to*

*provide a first path from at least one of the inductor and a power source to at least one of the first load terminal and the second load terminal of the load, and*

*provide a second path from at least one of the inductor and the power source to at least one of the first load terminal and the second load terminal of the load, and*

*wherein the plurality of switches includes:*

*a first switch connected between the power source and the first inductor terminal;*

*a second switch connected between ground and the first inductor terminal;*

*a third switch connected between the second inductor terminal and the second load terminal; and*

*a fourth switch connected between the second inductor terminal and the first load terminal.*

*18. The amplifier of claim 17, further comprising:*

*a first capacitor connected between ground and the first load terminal; and*

*a second capacitor connected between ground and the second load terminal.*

*19. The amplifier of claim 17, wherein the plurality of switches further includes:*

*a fifth switch connected between ground and the first load terminal; and*

*a sixth switch connected between ground and the second load terminal.*

*20. The amplifier of claim 19, wherein the plurality of switches further includes:*

*a seventh switch connected between ground and the second inductor terminal.*

*21. An amplifier, comprising:*

*an inductor having a first inductor terminal and a second inductor terminal;*

*a plurality of switches arranged to generate a switching waveform in response to (i) a control signal and (ii) a current provided by the inductor;*

*a load having a first load terminal and a second load terminal, wherein the load outputs an amplified signal based on (i) an input signal to be amplified by the amplifier and (ii) the switching waveform,*

*wherein, to generate the switching waveform, the plurality of switches are selectively controlled by the control signal to*

*provide a first path from at least one of the inductor and a power source to at least one of the first load terminal and the second load terminal of the load, and*

*provide a second path from at least one of the inductor and the power source to at least one of the first load terminal and the second load terminal of the load; and*

*a second load, wherein the second load outputs a second amplified signal based on the input signal and the switching waveform.*

*22. An amplifier, comprising:*

*an inductor having a first inductor terminal and a second inductor terminal;*

*a plurality of switches arranged to generate a switching waveform in response to (i) a control signal and (ii) a current provided by the inductor; and*

*a load having a first load terminal and a second load terminal, wherein the load outputs an amplified signal based on (i) an input signal to be amplified by the amplifier and (ii) the switching waveform,*

*wherein, to generate the switching waveform, the plurality of switches are selectively controlled by the control signal to*

*provide a first path from at least one of the inductor and a power source to at least one of the first load terminal and the second load terminal of the load, and*

*provide a second path from at least one of the inductor and the power source to at least one of the first load terminal and the second load terminal of the load, and*

*wherein a voltage of the amplified signal is greater than a voltage of the power source.*

*23. An amplifier, comprising:*

*an inductor having a first inductor terminal and a second inductor terminal;*

*a plurality of switches arranged to generate a switching waveform in response to (i) a control signal and (ii) a current provided by the inductor; and*

*a load having a first load terminal and a second load terminal, wherein the load outputs an amplified signal based on (i) an input signal to be amplified by the amplifier and (ii) the switching waveform,*

*wherein, to generate the switching waveform, the plurality of switches are selectively controlled by the control signal to*

*provide a first path from at least one of the inductor and a power source to at least one of the first load terminal and the second load terminal of the load, and*

*provide a second path from at least one of the inductor and the power source to at least one of the first load terminal and the second load terminal of the load, and*

*wherein the amplifier is configured as a single inductor, multiple output (SIMO) amplifier.*

* * * * *